(12) United States Patent
Gopalan et al.

(10) Patent No.: US 11,521,839 B2
(45) Date of Patent: Dec. 6, 2022

(54) INLINE MEASUREMENT OF PROCESS GAS DISSOCIATION USING INFRARED ABSORPTION

(71) Applicant: Applied Materials, Inc., Santa Clara, CA (US)

(72) Inventors: Ramesh Gopalan, Fremont, CA (US); Siamak Salimian, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 334 days.

(21) Appl. No.: 16/697,591

(22) Filed: Nov. 27, 2019

(65) Prior Publication Data

US 2021/0159060 A1 May 27, 2021

(51) Int. Cl.
*H01J 37/32* (2006.01)
*G01N 21/61* (2006.01)
*C23C 16/50* (2006.01)

(52) U.S. Cl.
CPC ........ *H01J 37/32981* (2013.01); *C23C 16/50* (2013.01); *G01N 21/61* (2013.01); *H01J 37/32449* (2013.01); *H01J 2237/24585* (2013.01); *H01J 2237/3321* (2013.01)

(58) Field of Classification Search
CPC .......... H01J 37/32981; H01J 37/32449; H01J 2237/24585; H01J 2237/3321; C23C 16/50; C23C 16/4405; G01N 21/61; G01N 2021/8416; G01N 2021/8578; G01N 21/3504
See application file for complete search history.

(56) References Cited

U.S. PATENT DOCUMENTS

| | | | |
|---|---|---|---|
| 9,583,333 B2* | 2/2017 | Chatterjee | ........... H01L 21/0217 |
| 2002/0040590 A1 | 4/2002 | Schley | |
| 2004/0225455 A1* | 11/2004 | Owen | ................ G01N 21/3504 |
| | | | 702/24 |
| 2007/0207275 A1 | 9/2007 | Nowak et al. | |
| 2010/0098882 A1 | 4/2010 | Lubomirsky et al. | |

FOREIGN PATENT DOCUMENTS

JP H04110650 A 4/1992

OTHER PUBLICATIONS

"Opti-Sense Series NDIR Monitor", Teledyne API, 2018 (2 pages).
(Continued)

*Primary Examiner* — Karen Kusumakar
(74) *Attorney, Agent, or Firm* — Patterson + Sheridan, LLP

(57) ABSTRACT

Embodiments of the present invention provide apparatus, systems and methods for measuring dissociation of a process gas generated by a RPS. In one embodiment, a method of measuring dissociation of a process gas includes receiving a process gas from a RPS, the process gas including a polyatomic molecule that dissociates into at least one free radical. The method further includes irradiating the process gas with IR radiation at one or more wavelengths, detecting the IR radiation that passes through the process gas, and determining a degree of dissociation of the polyatomic molecule in the process gas based, at least in part, on the detected IR radiation. In one embodiment, the method further comprises modifying one or more settings of the RPS, based, at least in part, on the determined degree of dissociation.

19 Claims, 7 Drawing Sheets

(56) References Cited

OTHER PUBLICATIONS

"Industrial Products—Series 7300 NDIR Gas Analyzers", Teledyne Analytical Instruments, www.teledyne-ai.com/products/7300.asp, accessed on Dec. 10, 2019 (1 page).
International Search Report and Written Opinion for PCT/US2020/056349 dated Jan. 20, 2021.
Chinese Office Action for Application No. 202090000978.7 dated Aug. 3, 2022.

\* cited by examiner

INLINE MEASUREMENT OF PROCESS GAS DISSOCIATION USING INFRARED ABSORPTION

BACKGROUND

Field

Embodiments of the present invention generally relate to apparatus and methods for measuring utilization efficiency of process gases, and more particularly to apparatus and methods for real-time measurement of dissociation of process gases using an infrared (IR) absorption diagnostic.

Description of the Related Art

Remote plasma sources (RPSs) dissociate gases such as nitrogen tri-fluoride ($NF_3$) to provide free F radicals for cleaning and/or pre-treatment of process chambers used in semiconductor processing. To optimize the cost of ownership of semiconductor process equipment such as dielectric and metal deposition thermal processing chambers, it is useful to measure the utilization efficiency by remote plasma sources (RPSs) of costly process gases.

For example, in some processes ($NF_3$) is dissociated into nitrogen and fluorine radicals in a RPS, and then fed into a process chamber following a semiconductor deposition process in order to clean the process chamber. The reactive fluorine radicals clean the chamber by reacting with silicon residues from the semiconductor deposition process, such as, for example, silicon oxide (SiO), or silicon di-oxide (SiO2), to form compounds such as silicon tetrafluoride ($SF_4$). In this example, because only the reactive fluorine radicals perform the requisite cleaning function, un-dissociated $NF_3$ in the gaseous flow provided by the RPS is wasted. Thus, in this example, the efficiency of the RPS is directly related to the degree of dissociation of $NF_3$ in the feedstock gas it supplies. Current diagnostics cannot directly measure, for example, free fluorine radicals in a RPS supplied feedstock gas. Rather, they measure cleaning by-products, such as, for example, $SF_4$ after cleaning has been performed on the process chamber, as opposed to the feedstock or reactant gases themselves as they are delivered by the RPS. Because $NF_3$ use is generally the largest cost item per wafer, it is desired to have an improved diagnostic for $NF_3$ utilization efficiency in semiconductor processing equipment.

SUMMARY

Embodiments of the present invention provide apparatus, system and methods for measuring dissociation of a process gas generated by a RPS. In one embodiment, apparatus for measuring dissociation of a process gas, includes a gas intake configured to receive a process gas from a RPS, the process gas including a polyatomic molecule that dissociates into at least one free radical. The apparatus further includes a measurement chamber coupled to the gas intake, comprising an infrared (IR) source configured to emit IR radiation at one or more wavelengths absorbed by the polyatomic molecule, and an IR detector configured to detect the IR radiation passing through the process gas. The apparatus further includes processing circuitry coupled to the detector configured to determine a degree of dissociation of the polyatomic molecule in the process gas based, at least in part, on the detected IR radiation.

In another embodiment, a method of measuring dissociation of a process gas includes receiving a process gas from a RPS, the process gas including a polyatomic molecule that dissociates into at least one free radical, the polyatomic molecule at least partially dissociated in the process gas. The method further includes irradiating the process gas with IR radiation at a wavelength absorbed by the polyatomic molecule, detecting the IR radiation that passes through the process gas, and determining a degree of dissociation of the polyatomic molecule in the process gas based, at least in part, on the detected IR radiation at the wavelength. The method further includes modifying one or more settings of the RPS, based, at least in part, on the determined degree of dissociation.

In yet another embodiment, a system includes a RPS to supply a process gas, the process gas including a polyatomic molecule that dissociates into at least one free radical, a conduit coupled to the RPS and to a processing chamber, and a measurement device coupled to the conduit. The measurement device includes an IR source configured to emit IR radiation at an absorption wavelength of the polyatomic molecule and an IR detector configured to detect the IR radiation that passes through the process gas. The IR detector is further configured to determine a degree of dissociation of the polyatomic molecule in the process gas based, at least in part, on the detected IR radiation.

In yet another embodiment, the system further includes a controller coupled to the detector configured to change one or more pre-defined settings of the RPS, in response to the determined degree of dissociation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

Figure 1:
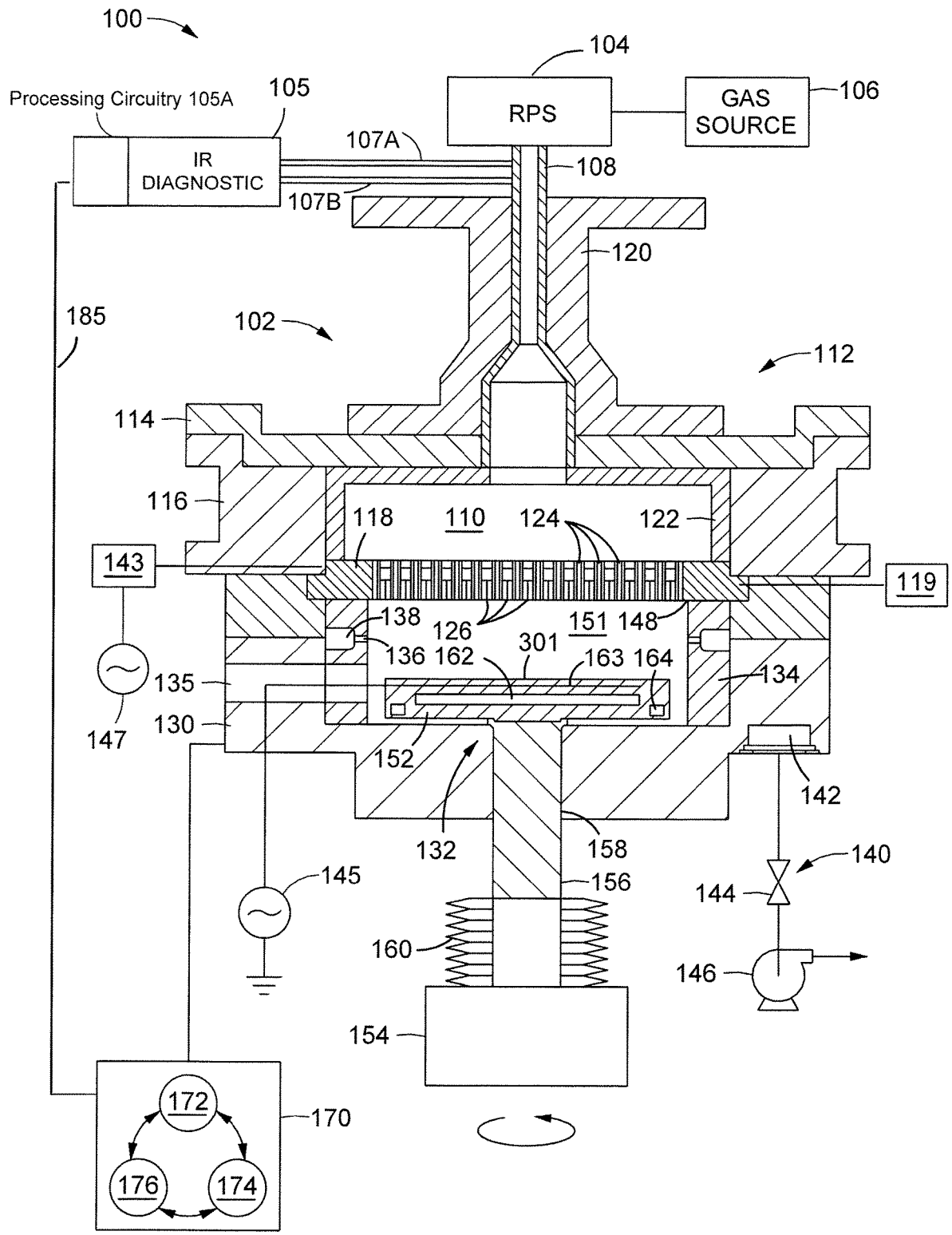
FIG. 1 depicts an example apparatus used to perform a deposition process provided with an IR diagnostic device in accordance with some embodiments of the present disclosure.

It is to be noted, however, that the appended drawings illustrate only exemplary embodiments of this invention and are therefore not to be considered limiting of its scope, for the invention may admit to other equally effective embodiments.

DETAILED DESCRIPTION

Various embodiments of the present disclosure include apparatus, systems and methods for measuring the dissociation of feedstock gases in real time using an infrared absorption diagnostic. In what follows, the terms "feedstock gas" and "process gas" may be used interchangeably, each referring to a reactant gas provided by a RPS to a semiconductor processing device, such as, for example, a chamber.

In semiconductor manufacturing processes, RPSs dissociate process gases such as, for example, $NF_3$ to provide free F− radicals for cleaning or pre-treatment of process chambers, both dielectric (e.g., silicon oxynitride (SiOxNy)) and metal (e.g., tungsten (W)). These process gases are expensive, and form a significant fraction of the cost per wafer in semiconductor processing. Thus, inline real-time diagnostics for measuring the dissociation of expensive process gases such as $NF_3$ in remote plasma sources RPS are needed for both cost efficiency and for effective control of downstream semiconductor processes. Moreover, efficient utilization of process gases may facilitate a lower cost of ownership of process equipment and a lower cost per wafer. Thus, predictive fingerprinting of dissociation performance of critical process gases is desired.

In embodiments, the absorption of IR radiation by reactant gases may be utilized to detect their degree of dissociation when used in the semiconductor processing industry. For example, $NF_3$ is commonly used to generate active fluorine ions (F−) in a remote plasma source (RPS). The free fluorine ions are then fed, via a conduit, to a process chamber, to clean the process chamber following a semiconductor layer deposition process. Similarly, a RPS is also used to dissociate NH3 to create NH— and H+ radicals for chemical vapor deposition (CVD) and flowable chemical vapor deposition (FCVD) applications. It is noted that feedstock reactant gases used in semiconductor processing, such as, for example, $NF_3$ or $NH_3$ show strong absorption of incident radiation in the far infrared (IR) portion of the electromagnetic spectrum. Each such gas absorbs at a unique IR wavelength within the spectrum. Thus, for example, IR radiation is absorbed by $NF_3$ at 11.1 um, and by $NH_3$ in a discrete set of wavelengths between 8 and 14 um. However, when these gases are dissociated into related free radicals, e.g., F−, NH− or H+ ions, these radicals do not absorb the IR radiation at these respective unique wavelengths. In embodiments, these molecular absorption properties may be used to determine the presence of polyatomic molecules in a gaseous feedstock provided by a RPS. In such embodiments, the fractional presence of these polyatomic molecules in a feedstock gas is inverse to their degree of dissociation in the gas.

In one or more embodiments, real-time measurement of the dissociation, and thus the utilization efficiency, of process gases may be determined using an IR diagnostic. In one or more embodiments, an IR diagnostic device may be a separate component to which a portion of a feedstock gas is diverted from a conduit connecting a RPS to a process chamber. In alternate embodiments, the IR diagnostic device may be attached to the conduit itself. In one or more embodiments, accurate in-line measurement of the dissociation of feedstock gases may provide predictability for, for example, preventive maintenance of, or refurbishment of, RPSs as well as diagnosis of efficiencies of use of process gases in semiconductor deposition process apparatus and systems. In one or more embodiments, the IR diagnostic device may comprise a detector, and processing circuitry coupled to the detector configured to determine a degree of dissociation of polyatomic molecule in a feedstock gas based, at least in part, on the detected IR radiation. In one or more embodiments, the processing circuitry may modify, or cause to be modified, one or more settings of the RPS, based, at least in part, on the determined degree of dissociation.

In one or more embodiments, the IR diagnostic may, for example, utilize a non-dispersive infrared (NDIR) sensing method. In other embodiments, for example, the IR diagnostic may utilize a Fourier transform infrared sensing method. IN one or more embodiments, absorption of radiation including, but not limited to, the infrared region of the electromagnetic spectrum is used to detect dissociation and utilization of polyatomic feedstock reactant gases such as, for example, $NF_3$ or $NH_3$. In the case of $NH_3$, the absorption is in a set of discrete wavelengths between 8-14 microns, and in the case of $NF_3$ the absorption is in a narrow band centered around 11.1 microns.

FIG. 1 is a cross-sectional view of an example processing chamber 100 for performing a deposition process that can deposit a dielectric material for semiconductor applications. Suitable example processing chambers that may be adapted for use with the teachings disclosed herein include, for example, an HDP-PRODUCER® or C3® processing chamber available from Applied Materials, Inc. of Santa Clara, Calif. It is contemplated that other processing chambers may also be adapted to benefit from one or more of the inventive features disclosed herein.

The processing chamber 100 includes a processing chamber body 102 and a remote plasma source 104 coupled to the processing chamber body 102. The remote plasma source 104 may be any suitable source that is capable of generating radicals. The remote plasma source 104 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. The remote plasma source 104 may include one or more gas sources 106 and the remote plasma source 104 may be coupled to the processing chamber 100 by a radical conduit 108. One or more process gases, which may be radical-forming gases, may enter the remote plasma source 104 via the one or more gas sources 106. The one or more process gases may comprise a chlorine-containing gas, a fluorine containing gas, inert gas, oxygen-containing gas, a nitrogen-containing gas, a hydrogen containing gas, or any combination thereof. As noted above, examples of the one or more gases include $NF_3$ and $NH_3$. Radicals generated in the remote plasma source 104 (e.g. F−, H+ or NH−) travel into the processing chamber 100 through the radical conduit 108 coupling to the processing chamber 100, reaching an interior processing region 151 defined in the processing chamber 100.

The radical conduit 108 is a part of a lid assembly 112, which also includes a radical cavity 110, a top plate 114, a lid rim 116, and a showerhead 118. The radical conduit 108 may comprise a material that is substantially nonreactive to radicals. For example, radical conduit 108 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. A representative example of a suitable $SiO_2$ material is quartz. The radical conduit 108 may be disposed within and supported by a radical conduit support member 120. The radical conduit support member 120 may be disposed on the top plate 114, which rests on the lid rim 116.

The radical cavity 110 is positioned below and coupled to the radical conduit 108, and the radicals generated in the remote plasma source 104 travel to the radical cavity 110 through the radical conduit 108. The radical cavity 110 is defined by the top plate 114, the lid rim 116 and the showerhead 118. Optionally, the radical cavity 110 may include a liner 122. The liner 122 may cover surfaces of the top plate 114 and the lid rim 116 that are exposed to the radical cavity 110. Radicals from the remote plasma source 104 pass through a plurality of tubes 124 disposed in the showerhead 118 to enter into an interior processing region 151. The showerhead 118 further includes a plurality of openings 126 that are smaller in diameter than the plurality of tubes 124. The plurality of openings 126 are connected to an internal volume (not shown) that is not in fluid communication with the plurality of tubes 124. One or more fluid sources 119 may be coupled to the showerhead 118 for introducing a fluid mixture into an interior processing region 151 of the processing chamber 100. The fluid mixture may include precursor, porogen, and/or carrier fluids. The fluid mixture may be a mixture of gases and liquids.

The processing chamber 100 may include the lid assembly 112, a chamber body 130 and a substrate support assembly 132. The substrate support assembly 132 may be at least partially disposed within the chamber body 130. The chamber body 130 may include a slit valve 135 to provide access to the interior of the processing chamber 100. The chamber body 130 may include a liner 134 that covers the interior surfaces of the chamber body 130. The liner 134 may include one or more apertures 136 and a pumping channel 138 formed therein that is in fluid communication with a vacuum system 140. The apertures 136 provide a flow path for gases into the pumping channel 138, which provides an egress for the gases within the processing chamber 100.

The vacuum system 140 may include a vacuum port 142, a valve 144 and a vacuum pump 146. The vacuum pump 146 is in fluid communication with the pumping channel 138 via the vacuum port 142. The apertures 136 allow the pumping channel 138 to be in fluid communication with the interior processing region 151 within the chamber body 130. The interior processing region 151 is defined by a lower surface 148 of the showerhead 118 and an upper surface 150 of the substrate support assembly 132, and the interior processing region 151 is surrounded by the liner 134.

The substrate support assembly 132 may include a substrate support member 152 to support a substrate (not shown) for processing within the chamber body 130. The substrate may be any standard wafer size, such as, for example, 300 mm. Alternatively, the substrate may be larger than 300 mm, such as 450 mm or larger. The substrate support member 152 may comprise aluminum nitride (AlN) or aluminum, depending on operating temperature. The substrate support member 152 may be configured to chuck the substrate to the substrate support member 152. For example, the substrate support member 152 may be an electrostatic chuck or a vacuum chuck.

The substrate support member 152 may be coupled to a lift mechanism 154 through a shaft 156 which extends through a centrally-located opening 158 formed in a bottom surface of the chamber body 130. The lift mechanism 154 may be flexibly sealed to the chamber body 130 by bellows 160 that prevents vacuum leakage from around the shaft 156. The lift mechanism 154 allows the substrate support member 152 to be moved vertically within the chamber body 130 between a process position and a lower, transfer position. The transfer position is slightly below the opening of the slit valve 135. During operation, the spacing between the substrate 301 and the showerhead 118 may be minimized in order to maximize radical flux at the substrate surface. For example, the spacing may be between about 100 mm and about 5,000 mm. The lift mechanism 154 may be capable of rotating the shaft 156, which in turn rotates the substrate support member 152, causing the substrate disposed on the substrate support member 152 to be rotated during operation.

One or more heating elements 162 and a cooling channel 164 may be embedded in the substrate support member 152. The heating elements 162 and cooling channel 164 may be used to control the temperature of the substrate during operation. The heating elements 162 may be any suitable heating elements, such as one or more resistive heating elements. The heating elements 162 may be connected to one or more power sources (not shown). The heating elements 162 may be controlled individually to have independent heating and/or cooling control on multi-zone heating or cooling. With the ability to have independent control on multi-zone heating and cooling, the substrate temperature profile can be enhanced at any giving process conditions. A coolant may flow through the cooling channel 164 to cool the substrate. The substrate support member 152 may further include gas passages extending to the upper surface 150 for flowing a cooling gas to the backside of the substrate.

A RF source power 143 may be coupled to the showerhead 118 through a RF source power matching box 147. The RF source power 143 may be low frequency, high frequency, or very high frequency. In one embodiment, the RF source power 143 is a high frequency RF generator that may generate high density plasma for deposit high density film layers. In one example, the RF source power 143 may serve as an inductively coupled RF energy transmitting device that can generate and control the inductive coupled plasma (ICP) generated in the interior processing region 151 above the substrate support member 152. Dynamic impedance matching from the RF source power matching box 147 may be provided when generating the inductive coupled plasma (ICP).

In addition to the RF source power 143, a RF bias power source 145 may be coupled to the substrate support member 152. The substrate support member 152 is configured as a cathode and includes an electrode 163 that is coupled to the RF bias power source 145. The RF bias power source 145 is coupled between the electrode 163 disposed in the substrate support member 152 and another electrode, such as the showerhead 118 or ceiling (top plate 114) of the chamber body 130. The RF bias power generated from the RF bias power source 145 excites and sustains a plasma discharge formed from the gases disposed in the interior processing region 151 of the chamber body 130.

In one mode of operation, the substrate 301 is disposed on the substrate support member 152 in the processing chamber 100. A process gas and/or gas mixture is introduced into the chamber body 130 through the showerhead 118 from the gas sources 106. The vacuum pump 146 maintains the pressure inside the chamber body 130 while removing deposition by-products.

A controller 170 is coupled to the processing chamber 100 to control operation of the processing chamber 100. The controller 170 includes a central processing unit (CPU) 172, a memory 174, and a support circuit 176 utilized to control the process sequence and regulate the gas flows from the gas sources 106. The CPU 172 may be any form of general purpose computer processor that may be used in an industrial setting. The software routines can be stored in the memory 174, such as random access memory, read only memory, floppy, or hard disk drive, or other form of digital storage. The support circuit 176 is conventionally coupled to the CPU 172 and may include cache, clock circuits, input/output systems, power supplies, and the like. Bi-directional communications between the controller 170 and the various components of the processing chamber 100 are handled through numerous signal cables.

An IR diagnostic device 105 is coupled via the gas intake and gas return tubes 107A and 107B, respectively, to the radical conduit 108. One of the tubes, for example tube 107A, diverts a portion of the gas in the radical conduit 108 into a measurement chamber of the IR diagnostic device 105 so that the dissociation of a polyatomic molecule in the process gas into reactive radicals may be measured using an IR diagnostic, as described above. The other of the tubes, for example tube 107B, returns the process gas after such measurement back to the radical conduit 108. In alternate embodiments (not shown), after measurement, the process gas may be exhausted to a pump, or, for example, tube 107B may be capped, and thus serve as a blind end. In either alternate case, the process gas, after measurement, need not be returned to the radical conduit 108. Because tube 107A diverts a small part of the gaseous flow in the radical conduit 108 for measurement purposes, tube 107A is sometimes known as a "sniff tube." IP diagnostic device 105 includes processing circuitry 105A. Processing circuitry 105A may be hardware, or it may include one or more processors configured with software, or any combination of the two, for example. In some embodiments, processing circuitry 105A determines a degree of dissociation of a process gas supplied by RPS 104 based on detected IR radiation, as described in detail below. The elements of the IR diagnostic device 105, and how it measures the dissociation of the polyatomic molecule in the process gas, are described in greater detail below, with reference to FIG. 3.

Figure 4:
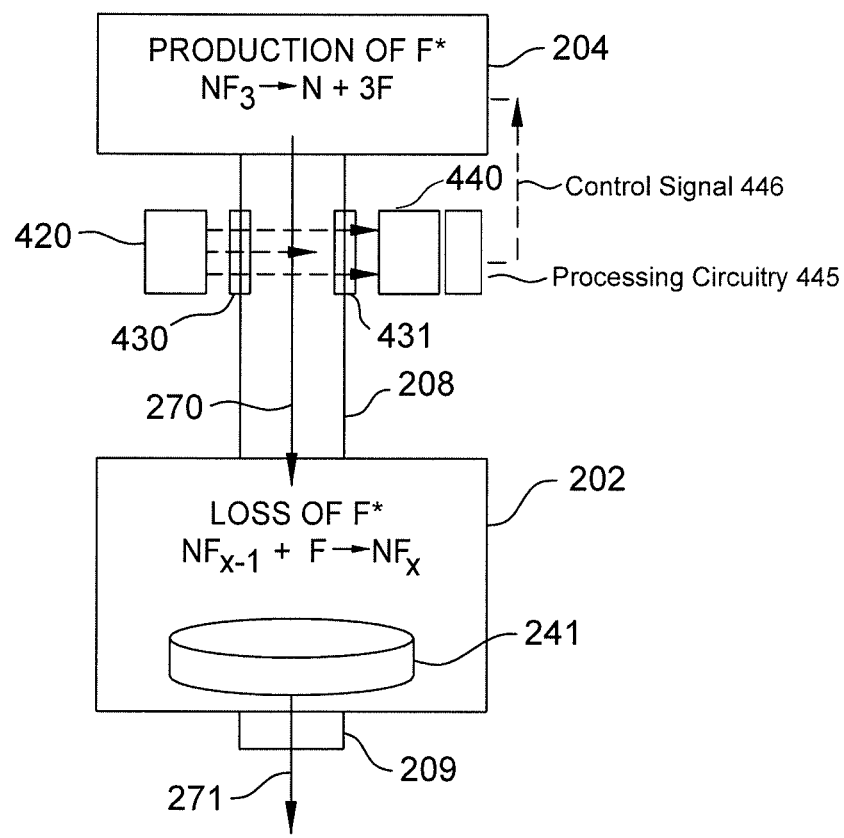
FIG. 4 depicts the apparatus schematic of FIG. 2B using the alternate example IR diagnostic apparatus of FIG. 3.

In other embodiments, the IR diagnostic device 105, including processing circuitry 105A, may be integrated into the radical conduit 108. An example of such other embodiments is depicted in FIG. 4, described below.

Continuing with reference to FIG. 1, the output of the IR diagnostic device 105, being a value of dissociation of a given polyatomic molecule of a process gas supplied by RPS 104, is sent to the controller 170, over signal path 185. In one or more embodiments, the controller 170 may store the value, along with one or more then operative pre-defined settings of the RPS 104 in the memory 174. Additionally, the controller 170 may report the measured degree of dissociation, along with one or more of the pre-defined settings of the RPS 104, to a user. In one or more embodiments, the controller 170 may use the dissociation results to change one or more pre-defined settings of the RPS 104, in a feedback control loop in order to increase the degree of dissociation, and thereby increase efficiency. In one or more embodiments, the pre-defined settings of the RPS 104 may include one or more of flow rate of the process gas, flow rate of an inert gas supplied together with the process gas (e.g., argon), pressure and power.

Figure 2A:
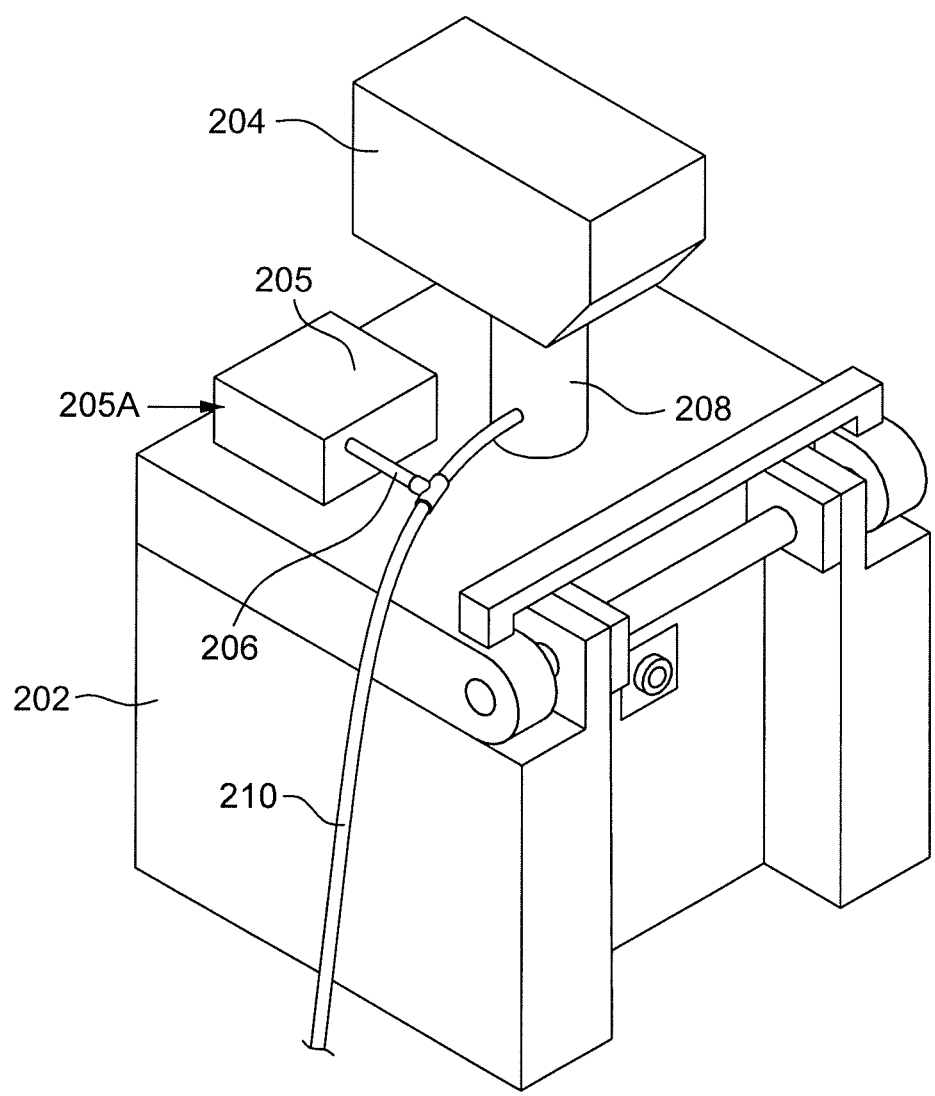
FIG. 2A depicts another example apparatus provided with an IR diagnostic device in accordance with some embodiments of the present disclosure.

FIG. 2A depicts a schematic drawing of another example apparatus in accordance with some embodiments of the present disclosure. The example apparatus of FIG. 2A is a schematic drawing of a processing chamber, such as, for example, the type of chamber provided by Applied Materials, Inc. With reference thereto, there is RPS 204 which supplies a process gas, and process chamber 202, on the upper surface of which the RPS 204 is provided. RPS 204 and process chamber 202 are connected by the radical conduit 208, through which the dissociated process gas supplied by RPS 204 is provided to the process chamber 202. There is a tube 210 that taps into the radical conduit 208, and a sniff tube 206 that connects, as shown, via a "T" connection, to tube 210. The end of the sniff tube 206 opposite to the "T" connection to tube 210 is connected to a non-dispersive infrared (NDIR) diagnostic device 205. Within NDIR diagnostic device 205 there is a measurement chamber (not shown; it is inside the device), and there is also provided processing circuitry 205A, as indicated. In one example, the NDIR diagnostic device may be a gas analyzer provided by Teledyne Analytical Instruments of San Francisco, Calif. In embodiments, the NDIR diagnostic device 205 measures the degree of dissociation of a polyatomic molecule of the process gas into the reactant radicals that perform the preparation or cleaning function of the process chamber 202, as described above. In some examples conduit 210 may reconnect to process chamber 202 (connection not shown in FIG. 2A). In alternate examples, as noted above with reference to tube 107B of FIG. 1, conduit 210 may feed into a pump, which exhausts the process gas, or, still alternatively, conduit 210 may terminate in a blind end.

Figure 2B:
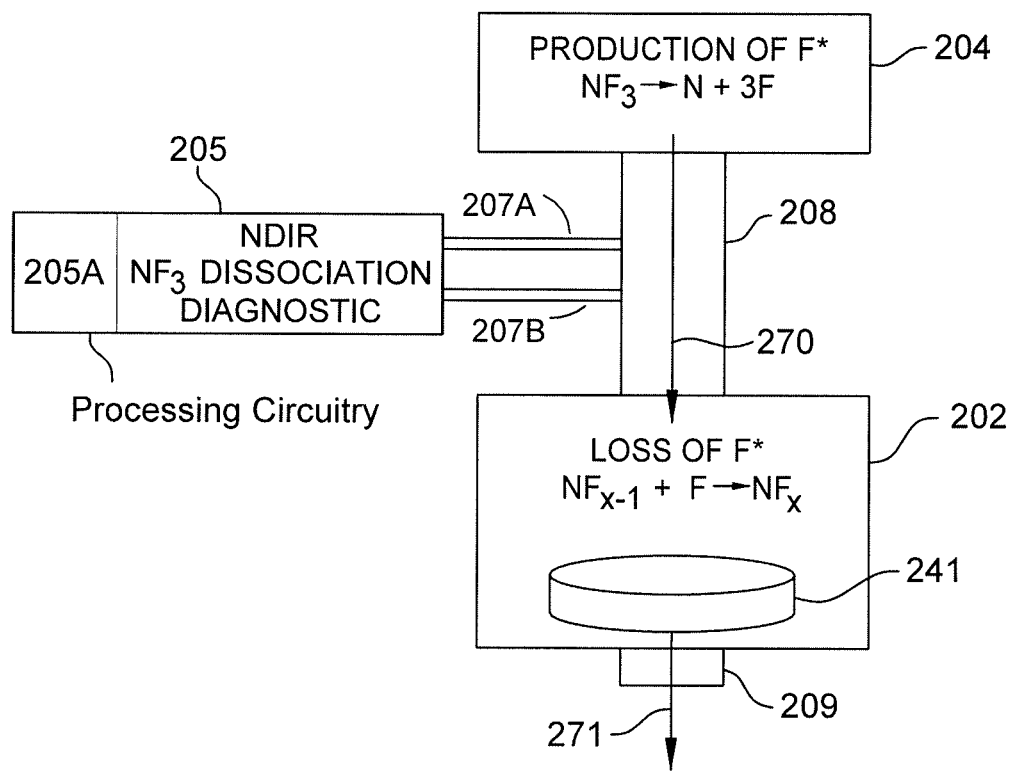
FIG. 2B depicts a schematic of the example apparatus of FIG. 2A, illustrating relevant chemical reactions for one example process gas.

FIG. 2B depicts a logical diagram of the example apparatus depicted in FIG. 2A, illustrating relevant chemical reactions for an example process gas $NF_3$. RPS 204, NDIR diagnostic device 205, processing circuitry 205A, radical conduit 208 and process chamber 202, all shown in FIG. 2B, are identical to those elements as shown in FIG. 2A, and thus have the same index numbers. Accordingly, they will not be described again in connection with FIG. 2B. With reference to FIG. 2B, within RPS 204, as shown, free radical fluorine (F*) is generated from $NF_3$, according to the reaction $NF_3 \rightarrow N+3F$, as shown. It is noted that the fluorine is one example of dissociated process gases that may be detected in accordance with various embodiments of this disclosure. Other example process gases include ammonia, NH3, which is dissociated into $NH^-$ and H radicals, and is used in flowable CVD-FCVD applications, as noted above. It is noted that the process gas is often partially dissociated, due to inefficiencies that may be due to the RPS' operation or mechanism.

Continuing with reference to FIG. 2B, from RPS 204, the dissociated radicals of the process gas, once emitted from RPS 204, are provided to process chamber 202. As shown, once they arrive in the process chamber 202 they begin to re-associate according to the equation, for the example of F* radicals, $NF_{x-1}+F \rightarrow NF_x$. Thus, in embodiments, in contrast to conventional approaches, it is more efficient to measure the degree of dissociation as soon as the process gas exits the RPS 204. Thus, in embodiments, NDIR diagnostic device 205, configured to perform an $NF_3$ dissociation diagnostic, taps into the process gas flow, shown schematically by arrow 270, close to the top of conduit 208. In the depicted example of FIG. 2B, NDIR samples the process gas flow by drawing a small sample via gas intake tube 207A and irradiating it with IR radiation at a pre-defined frequency, and detecting the level of that radiation that is absorbed by the process gas. In embodiments, using the detected level of radiation that is absorbed by the process gas, processing circuitry 205A determines a degree of dissociation of the process gas as supplied by RPS 204. Following the diagnostic performed on the small sample of process gas, in one embodiment, as shown, the gas is returned to radical conduit 208, via gas return tube 207B, to rejoin the flow 270 into process chamber 202. As noted above, in other embodiments (not shown) after irradiation, the process gas may be exhausted to a pump, or fed into a blind end.

Figure 5:
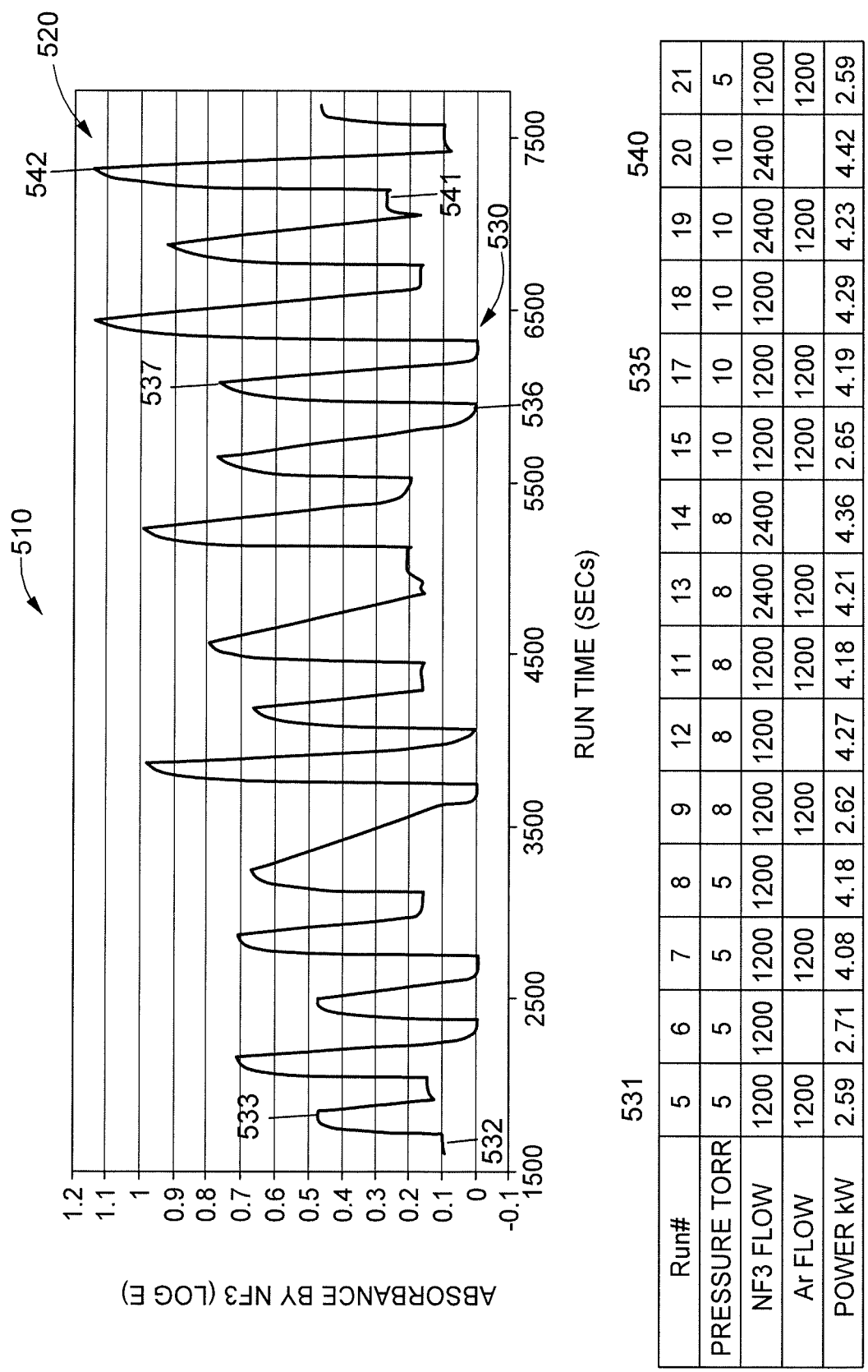
FIG. 5 depicts a plot of absorbance of $NF_3$ as a function of various combinations of pressure, gaseous flow and power, in accordance with some embodiments of the present disclosure.

While 100% dissociation is, of course, desired, so as to reap the full benefits of the costly process gas, the actual dissociation of a process gas in the output of an RPS is often less than that, and is a function of pressure, power and other variables, as is illustrated in FIG. 5, described in detail below. Thus, in embodiments, a measurement of dissociation is performed, close to the process gas source, and using the precision that an IR diagnostic provides.

Figure 3:
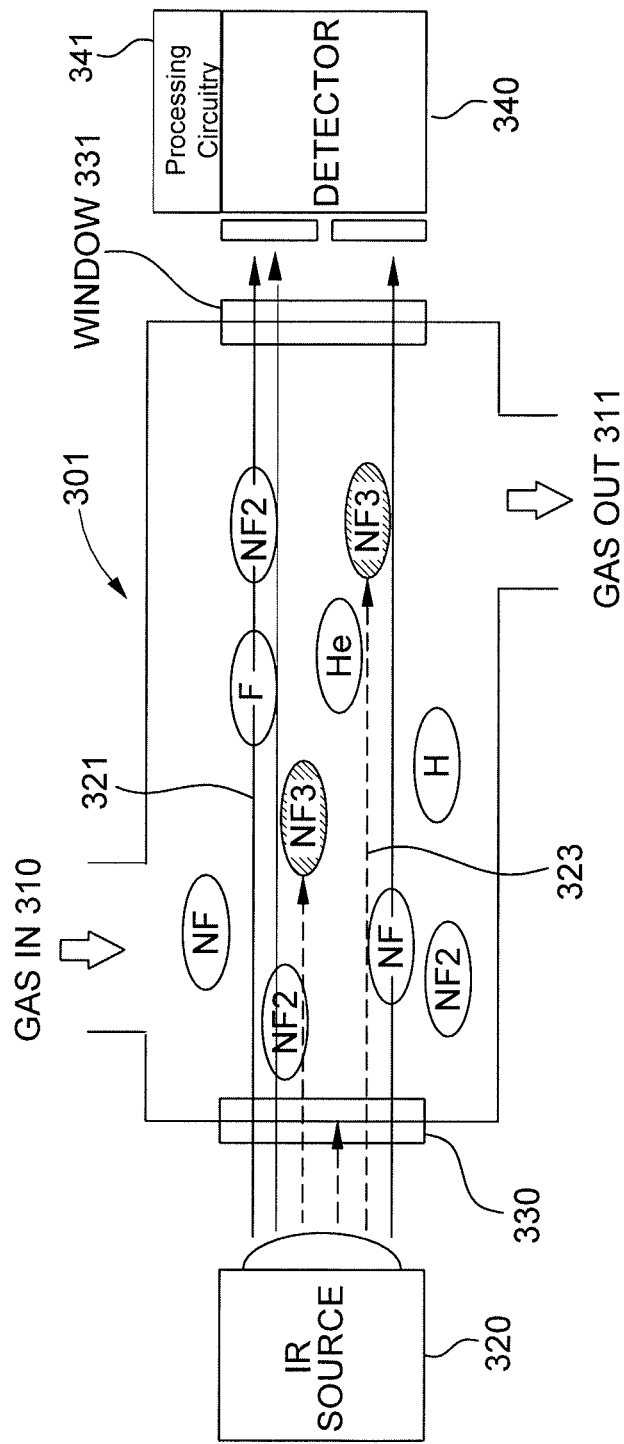
FIG. 3 depicts an alternate example IR diagnostic apparatus, in accordance with some embodiments of the present disclosure.

Continuing with reference to FIG. 2B, as shown, at the bottom of chamber 202 is a pedestal 241, on which substrates that are the subject of various semiconductor processes may be placed, and there is also shown an exhaust conduit 209, through which process gases are exhausted from the chamber 202, after they have been used within the chamber 202, as indicated by arrow 271 representing gaseous flow out of the chamber 202. In embodiments, a pump (not shown) may generally be used to exhaust these gases. As noted above, because these FIG. 3 depicts an alternate example IR diagnostic apparatus, in accordance with some embodiments of the present disclosure. With reference to FIG. 3, and in contrast to the example IR diagnostic device of FIGS. 1, 2A and 2B, in the example diagnostic apparatus of FIG. 3, there is no need for a "sniff tube" (such as, for example, tubes 206 and 210 in FIG. 2A) with which to sample a small portion of the process gas that leaves the RPS, and then to only irradiate that small sample to determine the degree of dissociation of the process gas. Rather, in the alternate example of FIG. 3, the radiation beams are sent directly through the conduit running from the RPS to the chamber, by affixing the IR source, and an IR detector, onto the conduit itself. IR detector 340 further includes processing circuitry 341, as shown.

Continuing with reference to FIG. 3, there is thus shown tube 301, which may be a portion of a radical conduit, which may be equivalent to a horizontal slice of tube 208 of FIGS. 2A and 2B, which connects a RPS to a process chamber, in accordance with some embodiments of the present disclosure. Thus, in the example of FIG. 3, the measurement chamber of the NDIR diagnostic device is wholly integrated with the radical tube, and thus the measurement chamber is simply a portion of the radical tube between IR source 320 and detector 340. As shown, the process gas enters tube 301 at the top of the tube, as indicated by the "gas in" inlet 310, and exits tube 301 at the bottom "gas out" outlet 311. The openings 310 and 311 are intended to be illustrative of gas flow in and out of the measurement chamber, but in reality are much wider, inasmuch as, as noted, what is shown is a slice of a radical conduit with which an NDIR diagnostic device has been integrated. As noted, and in contrast to a "sniff tube" embodiment as shown, for example, in FIG. 1 and FIGS. 2A and 2B, in the example embodiment of FIG. 3, all of the gaseous flow from the RPS to the process chamber passes through tube 301.

Continuing with reference to FIG. 3, in the depicted example, a process gas present in the gaseous flow is $NF_3$, and it is this gas which is desired to be measured. It is noted that various molecules and atoms are depicted in FIG. 3 in small ovals, labelled with the chemical name of the molecule or atom. Thus, within tube 301 are seen both molecules of $NF_3$, as well as its various dissociation products $NF_2$, NF and F. The $NF_3$ is shown in shaded ovals, for easy identification. There are also shown other moieties in tube 301, namely a hydrogen radical labeled "H" and a Helium molecule labeled He. Adjacent to the left side of tube 301 is an IR source 320, configured to emit radiation in a wavelength or wavelengths absorbed by NF3, but not absorbed by the other moieties present within the tube. For example, the radiation from IR source 320 may be primarily at 11.1 um, which is a wavelength that is absorbed by $NF_3$. In embodiments, the IR radiation passes through entrance window 330 and enters tube 301. In FIG. 3, the radiation is represented by horizontal lines. These horizontal lines are of two types, namely, solid lines 321 and dashed lines 323. The solid lines 321 are not absorbed by any moiety in the tube 301, and thus pass through the tube and out through exit window 331. However, the dashed lines 323 represent rays of radiation that do not make it out of the tube 301, and thus do not exit through exit window 331. This is because on their way through the gas, they encounter $NF_3$ molecules, which absorb them. This is indicated in FIG. 3 by the two dashed line rays of radiation that stop at the two $NF_3$ molecules. As shown, all of the solid lines 321 pass through exit window 331 and land on detector 340, which detects them. Thus, knowing the amount of radiation that was emitted by IR source 320 at 11.1 um, and measuring the amount of that radiation that was detected at detector 340, allows the calculation of fractional or percentage dissociation of the $NF_3$. In embodiments, this calculation may be performed by processing circuitry 341, as noted above. The greater the fraction of emitted radiation that is detected on the other side of the tube, the lower the absorbance, and thus the greater the dissociation of $NF_3$ in the output of the RPS.

FIG. 4 depicts the schematic of FIG. 2B using the alternate example IR diagnostic apparatus of FIG. 3. Thus, in the example of FIG. 4 the IR diagnostic apparatus is provided directly on conduit tube 208 that connects RPS 204 with process chamber 202. Aspects of FIG. 4 that have already been described with reference to FIG. 2B are not repeated here, and thus only the elements bearing index numbers that begin with a "4" are described. It is noted that the index numbers of the elements of the IR diagnostic apparatus as depicted in FIG. 4 have the same tens and units digits as they do in the example IR diagnostic apparatus of FIG. 3, for ease of correlation between the two figures.

Continuing with reference to FIG. 4, there is shown IR source 420, which emits rays of radiation (shown as horizontal dashed arrows) through entrance window 430 and into conduit 208. The radiation is, in this example, a narrow band centered around 11.1 urn, which is absorbed by $NF_3$. As described above, some of the rays of radiation simply pass through the gas in conduit 208, out through exit window 431 and onto detector 445. These "passing" rays did not encounter any $NF_3$ molecules as they passed through the conduit 208. Other rays of radiation that are emitted at IR source 420 that do encounter $NF_3$ molecules in conduit 208 are absorbed by such $NF_3$ molecules and do not make it through exit window 431 to detector 440. As noted above, knowing the amount of radiation that was emitted by IR source 420 at 11.1 um, and measuring the amount of that radiation that was detected at detector 340, allows the calculation of fractional or percentage dissociation of the $NF_3$. The greater the fraction of emitted radiation that is detected at detector 440 on the other side of conduit 208, the lower the absorbance, and thus the greater the dissociation of $NF_3$ in the output of RPS 204.

Continuing still further with reference to FIG. 4, in one or more embodiments, there is processing circuitry 445 integrated with the emitter-detector assembly. Processing circuitry 445 calculates the fractional or percentage dissociation of the $NF_3$ from the IR radiation received at detector 440, and, if it is too low, and RPS 204 is not operating efficiently in dissociating the $NF_3$ and generating the needed free radical, it sends a feedback control signal 446 to RPS 204 to increase the dissociation percentage of the raw $NF_3$. This is an automatic feedback mechanism that obviates the need for a user to manually check dissociation percentages as measured by detector 445 and then make adjustments to RPS 204. Thus, in the example of FIG. 4, processing circuitry 445 not only calculates the dissociation percentage of the $NF_3$ in the gas supplied by RPS 204, it also includes control logic to send feedback control signals to the RPS 204.

FIG. 5 depicts a plot 510 of absorbance by IR radiation by $NF_3$ as a function of various example combinations of pressure, gaseous flow and power, to determine the degree of the $NF_3$ dissociation, in accordance with some embodiments of the present disclosure. In the experimental setup used to generate the plots of FIG. 5, a RPS was used to generate free F− radicals from a $NF_3$ feedstock. The RPS parameter settings for power, pressure, and flow rate of the $NF_3$ were varied over time, as shown in the parameter data for each run. In some of the runs, as shown, argon gas was also supplied, and when it was a flow rate of 1200 SCCM (standard cubic centimeters per minute) was consistently used. As noted above, feedstock reactant gases used in semiconductor processing, such as, for example, $NF_3$ or $NH_3$ show strong absorption of incident radiation in the far IR portion of the electromagnetic spectrum. Thus, for example, IR radiation is absorbed by $NF_3$ at 11.1 um, and by $NH_3$ in a discrete set of wavelengths between 8 and 14 um, but when these gases are dissociated into related free radicals, e.g., F−, NH− or H+ ions, the free radicals do not absorb the IR radiation at these respective unique wavelengths. In one or more embodiments, leveraging these absorption properties allows for the measurement of dissociation percentage in a process gas, as illustrated for $NF_3$ in FIG. 5.

Continuing with reference to FIG. 5, the vertical axis of plot 510 reads "Absorbance by $NF_3$ (LOG E)", and the horizontal axis of plot 510 reads "run time." Thus, as shown by the interval covered by the horizontal axis, over the course of 8000 seconds or so several examples of radiation of a gas sample was performed. The plot begins at about 1500 seconds into the test, and ends at about 7500 seconds, thus showing plots of absorbance over time for runs 5 through 21. As noted, various parameters of the RPS were varied between runs. In the example runs shown in FIG. 5, the vertical position 530 indicates 0% absorbance, and thus 100% dissociation, and the vertical positon 520 shows 100% absorbance, and thus 0% dissociation.

Continuing with reference to FIG. 5, of the various runs illustrated, three runs in particular are noteworthy, namely run 5 at the column labeled 531, run 17 at the column labeled 535, and run 20 at the column labeled 540. These three runs are next described.

Beginning with run 5 at column 531, the $NF_3$ flow rate was set at 1200, the argon flow rate was set at 1200, the pressure was 5 Torr, and the power supplied to the RPS approximately 2.6 kW. It is noted that in each run representd in plot 510 of FIG. 5, the run begins with the RPS turned on for a short time, and a minimum level of absorbance at that set of parameters is measured. The RPS is then turned off, and the process gas continues to flow at the indicated flow rate. Thus, each run begins at a minimum absorbance and steeply rises to a peak absorbance, and thus, as shown, for each run there is a peak absorbance value in the midpoint of the run. By taking the ratio of the minimum absorbance to the maximum (peak) absorbance for each run, a degree of non-dissociation when the RPS is on is provided. The theory behind this calculation is that if the minimum absorbance is, say 0.2, and the maximum absorbance, is, say 0.75, then at the minimum absorbance conditions, when the RPS was initially turned on, the absorbance was 0.2/0.75, or 26.67% of its maximum possible value, corresponding to a 26.67% of the $NF_3$ molecules being un-dissociated, and thus available to absorb radiation, even when the RPS is actively creating radicals. Subtracting this ratio from 1.0 gives the total dissociation fraction for the relevant process gas, in this example 73.33%.

Thus, based on the NDIR diagnostic, in run 5 the $NF_3$ was measured at 78% dissociation into free radicals. This is calculated as follows. Run 5 begins at point 532 in FIG. 5, where the RPS is turned on, as noted above. At this point the plot shows absorbance of 0.1. Subsequently the RPS is turned off, but the $NF_3$ continues to flow, increasing the percentage present of un-dissociated molecular $NF_3$, reaching a peak level of absorbance at point 533, of 0.47. The ratio of the value at 532 to the value at 533 gives 0.1/0.47, or 0.213. Subtracting this from 1.0 gives 0.787, or 78.7% dissociation at point 532, when the RPS was on.

Continuing with reference to FIG. 5, for run 17 at column 535, the $NF_3$ flow rate was the same as for run 5, at 1200 SCCM, the argon flow rate was also set at 1200 SCCM (no different than run 5), but the pressure was now doubled to 10 Torr, and the power supplied to the RPS also significantly increased, from 2.59 kW to 4.19 kW. Based on the NDIR diagnostic, at the beginning of run 17, at point 536, the $NF_3$ was measured at 0% absorbance, and thus, within the accuracy of measurement, no presence of un-dissociated $NF_3$, corresponding to a 100% dissociation into free radicals. The peak absorbance for run 17, at point 537, was higher than for run 5, at approximately 0.76, and thus indicating a greater concentration of $NF_3$ there. However, because the absorbance at point 536 was 0.0, any value at point 537 results in a division of 0.0 (at point 536) by that value, which always gives 0. Subtracting the 0.0 from 1.0 yields a 100% dissociation when the RPS is operating. Thus, as shown in run 17, and in general, a higher power and higher pressure in the RPS lead to a higher degree of dissociation of the polyatomic process gas. However, even if the pressure and power are increased, if the flow rate of the process gas is also increased, this may be too much for the RPS to process without further increase in pressure and power. This is illustrated in run 20, next described.

Continuing still further with reference to FIG. 5, run 20 is now considered. Run 20, shown in column 540, has the same pressure (10 Torr), and a slightly higher power (4.42 kW) than run 17, described above. However, at the beginning of run 20, at point 541, the absorbance is approximately 0.27, and the maximum absorbance is, as shown at point 542, approximately 1.13. Thus, the un-dissociation fraction is 0.27/1.13=0.24, for a dissociation fraction of 1.0−0.24=0.76, or 76%. This value is even lower than the 78.7% dissociation seen in run 5, described above. The reason for this is clear when the $NF_3$ flow rate is considered. Run 20 had a $NF_3$ flow rate of 2400 SCCM, the highest used in all of the runs plotted in FIG. 5. Thus, even though run 20 had the highest power of all runs, and the high pressure of 10 Torr, the RPS could not fully dissociate the $NF_3$ present. Thus, for example, in embodiments according to the present disclosure where a feedback loop is implemented between NDIR diagnostic and RPS control, such as is illustrated in FIG. 4 by arrow 446, the RPS would be sent a control signal to lower the $NF_3$ flow rate, or increase the pressure and/or power (if not at a maximum already), or some combination of modification of all three parameters, until the dissociation percentage reached 0% or some pre-determined acceptable value close to 0%.

Figure 6:
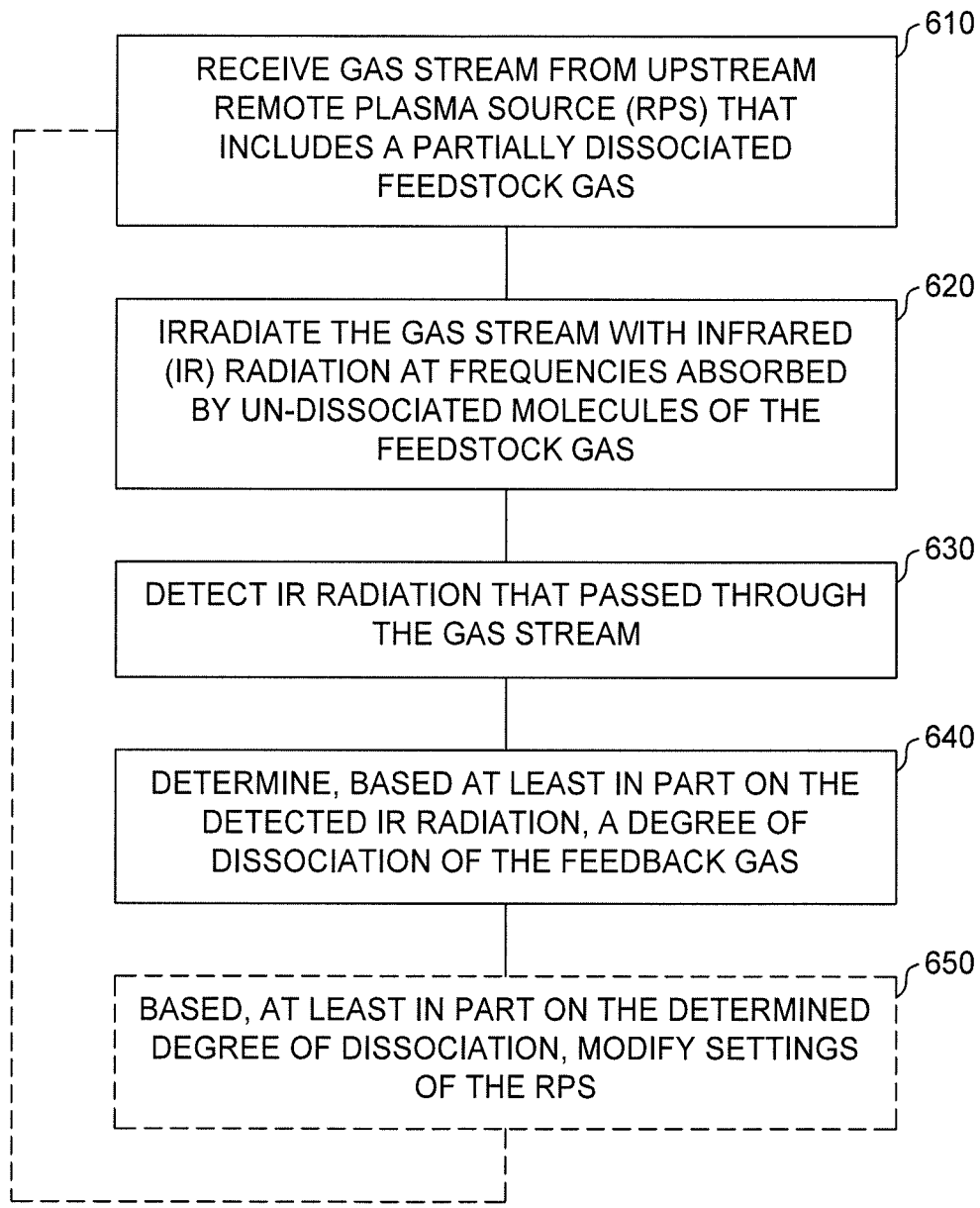
FIG. 6 is a process flow diagram illustrating a method for real-time measurement of dissociation and utilization efficiency of a process gas using IR absorption in accordance with some embodiments of the disclosure.

FIG. 6 depicts a process flow diagram illustrating a method for real-time measurement of dissociation and utilization efficiency of a process gas using IR absorption in accordance with embodiments disclosed herein. The depicted embodiment of the method includes blocks 610 through 650. In other embodiments, method 600 may have greater, or fewer, blocks.

At block 610, a gas stream is received from an upstream RPS. The gas stream includes a partially dissociated feedstock gas. In embodiments, the gas stream may be output by the RPS to a conduit connecting the RPS to a processing chamber of a semiconductor processing device. An example of this is shown in FIG. 1, where RPS 104 obtains a reactant gas from gas source 106, processes the gas to form a plasma, and supplies the gas in a partially dissociated (or, if RPS 104 is running at full efficiency, a wholly dissociated) state to radical conduit 108. Radical conduit 108 is coupled to process chamber body 120 to which the dissociated process gas is supplied. As further shown in FIG. 1, for example, a gas intake tube 107A may divert a small sample of the gas stream to an IR diagnostic device 105.

At block 620, the gas stream received from the upstream RPS is irradiated with IR radiation at frequencies absorbed by un-dissociated molecules of the polyatomic feedstock gas. For example, the feedstock gas may be $NF_3$, and the IR radiation may be a set of discrete frequencies within a narrow band centered around 11.1 microns.

At block 630, the IR radiation that passed through the gas stream is detected. For example, this may be done using detector 340 of FIG. 3, or detector 440 of FIG. 4.

At block 640 it is determined, based at least in part on the detected IR radiation, a degree of dissociation of the feedstock gas. For example, for a feedstock gas $NF_3$, which dissociates into N+3F– as shown in FIG. 2B, an amount of IR radiation at 11.1 um may be used by an IR source, such as, for example, IR source 320 of FIG. 3, to irradiate the feedstock gas. Then, the fraction of that emitted IR radiation that reaches a detector, such as, for example, detector 340 of FIG. 3, or, for example, detector 440 of FIG. 4, may be measured, and that number correlated by processing circuitry 445 of the detector 440 to a fraction or percentage of absorbance of $NF_3$ by the feedstock gas, as described above in connection with the example runs 5, 17 and 20 of FIG. 5. As further described above, that calculated absorbance value may then be correlated, by the processing circuitry 445, for example, to a dissociation value of $NF_3$ in the feedstock gas when the RPS is operating. As noted above, the dissociation value bears an inverse relationship to the fractional absorbance. Thus, zero absorbance of $NF_3$ by the feedstock gas indicates 100% dissociation of the $NF_3$ into the useful F– radicals.

Block 650 indicates an optional additional block of method 600, where, based at least in part on the determined degree of dissociation, settings of the RPS may be modified. For example, the modification of the RPS settings may be automatic, where, for example, after calculating a dissociation value of $NF_3$ in the feedstock gas when the RPS is operating processing circuitry of a detector may include control logic to compare the calculated dissociation value to a pre-defined threshold, and may send a control signal to the RPS to modify its settings, such as is illustrated in FIG. 4, and described above. Or, alternatively, in some examples, the control logic may have a predefined range in which it may modify RPS settings, and if a limit of the predefined modification range is sought to be exceeded, an alarm, message or other communication may be issued by the control logic, to alert a technician to the problem, who, for example, may then make adjustments to the parameters of the RPS. Still alternatively, the modification at optional block 650 may be wholly manual, after a technician monitoring the dissociation percentage as determined by processing circuitry of an example NDIR diagnostic device, notices a drop below a pre-determined acceptable level, for example 90%, or alternatively, 95%, or higher.

Thus, in embodiments, the dissociation of feedstock gases may be measured by an infrared absorption diagnostic, and thus the efficiency of the use of process gases may be determined. In some embodiments, a feedback controller may be integrated with an IR diagnostic device, and, based on levels of process gas dissociation dropping below a pre-defined level, parameters of the RPS automatically changed by the controller. In embodiments, accurate, in-line measurement of dissociation of feedstock gases provides predictability for preventive maintenance or refurbishment of RPSs as well as diagnosis of efficient use of process gases in such RPS devices. In some embodiments, as noted, diagnostics also provide feedback for process control.

Although aspects have been described herein as utilizing methods and systems for increasing accuracy in layer alignment by reducing measurement error(s) in the actual location of an alignment mark(s), these descriptions are not intended in any way to limit the scope of the material described herein.

While the foregoing is directed to embodiments of the present invention, other and further embodiments of the invention may be devised without departing from the basic scope thereof, and the scope thereof is determined by the claims that follow.

What is claimed is:

1. Apparatus for measuring dissociation of a process gas, comprising:
   a gas intake configured to receive a process gas from a remote plasma source (RPS), the process gas including a polyatomic molecule that dissociates into at least one free radical, wherein the RPS provides the process gas via a conduit to a semiconductor deposition process chamber;
   a measurement chamber coupled to the gas intake, comprising:
     an infrared (IR) source configured to emit IR radiation at one or more wavelengths absorbed by the polyatomic molecule;
     an IR detector configured to detect the IR radiation that passes through the process gas;
   and
   processing circuitry coupled to the detector configured to determine a degree of dissociation of the polyatomic molecule in the process gas based, at least in part, on the detected IR radiation.

2. The apparatus of claim 1, wherein the gas intake diverts a portion of the process gas from the conduit to the measurement chamber.

3. The apparatus of claim 1, wherein the measurement chamber is integrated within the conduit.

4. The apparatus of claim 1, further comprising a gas outflow coupled to either an intake of the semiconductor processing chamber or the conduit.

5. The apparatus of claim 1, wherein the measurement chamber further comprises a first window, through which the IR source emits the IR radiation into the measurement chamber.

6. The apparatus of claim 5, wherein the measurement chamber further comprises a second window, through which the IR radiation passes to the detector.

7. The apparatus of claim 1, wherein the IR source is further configured to emit IR radiation at multiple wavelengths, and wherein the detector further comprises one or more filters configured to isolate IR radiation at the one or more wavelengths absorbed by the polyatomic molecule.

8. The apparatus of claim 1, wherein the process gas is provided by the RPS together with at least one additional inert gas.

9. The apparatus of claim 8, wherein the process gas and the at least one additional inert gas are each provided by the RPS at one or more of a pre-defined pressure and a pre-defined flow rate.

10. The apparatus of claim 1, wherein the processing circuitry is further configured to change one or more pre-defined settings of the RPS, in response to the determined degree of dissociation.

11. An apparatus for measuring dissociation of a process gas, comprising:
a gas intake configured to receive a process gas from a remote plasma source (RPS), the process gas including a polyatomic molecule that dissociates into at least one free radical, wherein the process gas is one of nitrogen trifluoride ($NF_3$) or ammonia ($NH_3$);
a measurement chamber coupled to the gas intake, comprising:
an infrared (IR) source configured to emit IR radiation at one or more wavelengths absorbed by the polyatomic molecule;
an IR detector configured to detect the IR radiation that passes through the process gas;
and
processing circuitry coupled to the detector configured to determine a degree of dissociation of the polyatomic molecule in the process gas based, at least in part, on the detected IR radiation.

12. A method of measuring dissociation of a process gas generated by a RPS, comprising:
receiving a process gas from a RPS, the process gas including a polyatomic molecule that dissociates into at least one free radical, the polyatomic molecule at least partially dissociated in the process gas, wherein the RPS provides the process gas via a conduit to a semiconductor deposition process chamber;
irradiating the process gas with IR radiation at an absorption wavelength of the polyatomic molecule;
detecting IR radiation at the absorption wavelength passing through the process gas; and
determining a degree of dissociation of the polyatomic molecule in the process gas based, at least in part, on the detected IR radiation.

13. The method of claim 12, and wherein receiving the process gas further comprises diverting a portion of the process gas from the conduit to a measuring device.

14. The method of claim 12, further comprising:
irradiating the process gas at multiple wavelengths of IR radiation, and
filtering the IR radiation passing through the process gas to isolate the absorption wavelength.

15. The method of claim 12, further comprising modifying one or more settings of the RPS, based, at least in part, on the determined degree of dissociation.

16. A method of measuring dissociation of a process gas generated by a RPS, comprising:
receiving a process gas from a RPS, the process gas including a polyatomic molecule that dissociates into at least one free radical, the polyatomic molecule at least partially dissociated in the process gas, wherein the process gas is one of nitrogen trifluoride ($NF_3$) or ammonia ($NH_3$);
irradiating the process gas with IR radiation at an absorption wavelength of the polyatomic molecule;
detecting IR radiation at the absorption wavelength passing through the process gas; and
determining a degree of dissociation of the polyatomic molecule in the process gas based, at least in part, on the detected IR radiation.

17. A system, comprising:
a RPS to supply a process gas including a polyatomic molecule that dissociates into at least one free radical;
a conduit coupled to the RPS and to a processing chamber, wherein the RPS provides the process gas via a conduit to a semiconductor deposition process chamber; and
a measurement device coupled to the conduit, comprising:
an infrared (IR) source configured to emit IR radiation at an absorption wavelength of the polyatomic molecule; and
an IR detector configured to detect the IR radiation that passes through the process gas,
wherein the IR detector is further configured to determine a degree of dissociation of the polyatomic molecule in the process gas based, at least in part, on the detected IR radiation.

18. The system of claim 17, further comprising a controller coupled to or integrated with the IR detector configured to change one or more pre-defined settings of the RPS, in response to the determined degree of dissociation.

19. The system of claim 18, wherein the pre-defined settings of the RPS include at least one of flow rate of the process gas, flow rate of an inert gas supplied together with the process gas, pressure and power.

* * * * *